(12) United States Patent
Yuferev et al.

(10) Patent No.: US 11,348,861 B2
(45) Date of Patent: May 31, 2022

(54) SEMICONDUCTOR PACKAGE AND METHOD OF MANUFACTURING A SEMICONDUCTOR PACKAGE

(71) Applicant: Infineon Technologies Austria AG, Villach (AT)

(72) Inventors: Sergey Yuferev, Villach (AT); Robert Fehler, Regensburg (DE); Petteri Palm, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 77 days.

(21) Appl. No.: 17/024,150

(22) Filed: Sep. 17, 2020

(65) Prior Publication Data

US 2021/0005536 A1 Jan. 7, 2021

Related U.S. Application Data

(63) Continuation of application No. 16/287,318, filed on Feb. 27, 2019, now Pat. No. 10,811,342.

(30) Foreign Application Priority Data

Feb. 28, 2018 (EP) .................................... 18159294

(51) Int. Cl.
*H01L 23/52* (2006.01)
*H01L 23/482* (2006.01)
(Continued)

(52) U.S. Cl.
CPC ...... *H01L 23/4824* (2013.01); *H01L 23/3107* (2013.01); *H01L 24/25* (2013.01);
(Continued)

(58) Field of Classification Search
CPC . H01L 23/4824; H01L 23/3107; H01L 24/25; H01L 2224/04105;
(Continued)

(56) References Cited

U.S. PATENT DOCUMENTS 7,394,150 B2  7/2008  Kasem et al.
7,476,978 B2  1/2009  Otremba
(Continued)

FOREIGN PATENT DOCUMENTS

EP       2731128 A2    5/2014

*Primary Examiner* — Luan C Thai
(74) *Attorney, Agent, or Firm* — Murphy, Bilak & Homiller, PLLC

(57) ABSTRACT

A semiconductor package includes a semiconductor die having a semiconductor device, and first and second contact pads arranged on opposite surfaces of the die. The semiconductor die is embedded in a dielectric layer. The semiconductor package also includes one or more first package contact pads and one or more second package contact pads arranged on a first major surface of the semiconductor package. The first contact pad of the die is coupled to the one or more first package contact pads, and the second contact pad of the die is coupled to the one or more second package contact pads. In operation, the semiconductor device causes a current path between the first contact pad and the second contact pad. The package contact pads are arranged on the first major surface of the semiconductor package to provide multiple non-parallel current paths.

20 Claims, 9 Drawing Sheets

(51) Int. Cl.
*H01L 23/31* (2006.01)
*H01L 23/00* (2006.01)

(52) U.S. Cl.
CPC ............. *H01L 2224/04105* (2013.01); *H01L 2224/2518* (2013.01); *H01L 2224/8203* (2013.01); *H01L 2924/1305* (2013.01); *H01L 2924/13055* (2013.01); *H01L 2924/13091* (2013.01); *H01L 2924/30101* (2013.01); *H01L 2924/30107* (2013.01)

(58) Field of Classification Search
CPC ..... H01L 2224/2518; H01L 2924/1305; H01L 2924/13055; H01L 2924/13091; H01L 2924/30107
USPC ....................................................... 257/774
See application file for complete search history.

(56) References Cited

U.S. PATENT DOCUMENTS

| | | |
|---|---|---|
| 7,799,614 B2 | 9/2010 | Otremba et al. |
| 8,129,225 B2 | 3/2012 | Landau et al. |
| 8,441,804 B2 * | 5/2013 | Haeberlen ......... H01L 23/49575 361/760 |
| 8,507,320 B2 | 8/2013 | Otremba et al. |
| 8,975,711 B2 | 3/2015 | Otremba et al. |
| 2009/0194856 A1 | 8/2009 | Gomez |
| 2009/0261468 A1 | 10/2009 | Kroeninger et al. |
| 2012/0235162 A1 | 9/2012 | Isobe et al. |
| 2015/0255380 A1 | 9/2015 | Chen |
| 2016/0013153 A1 | 1/2016 | Meyer |

* cited by examiner

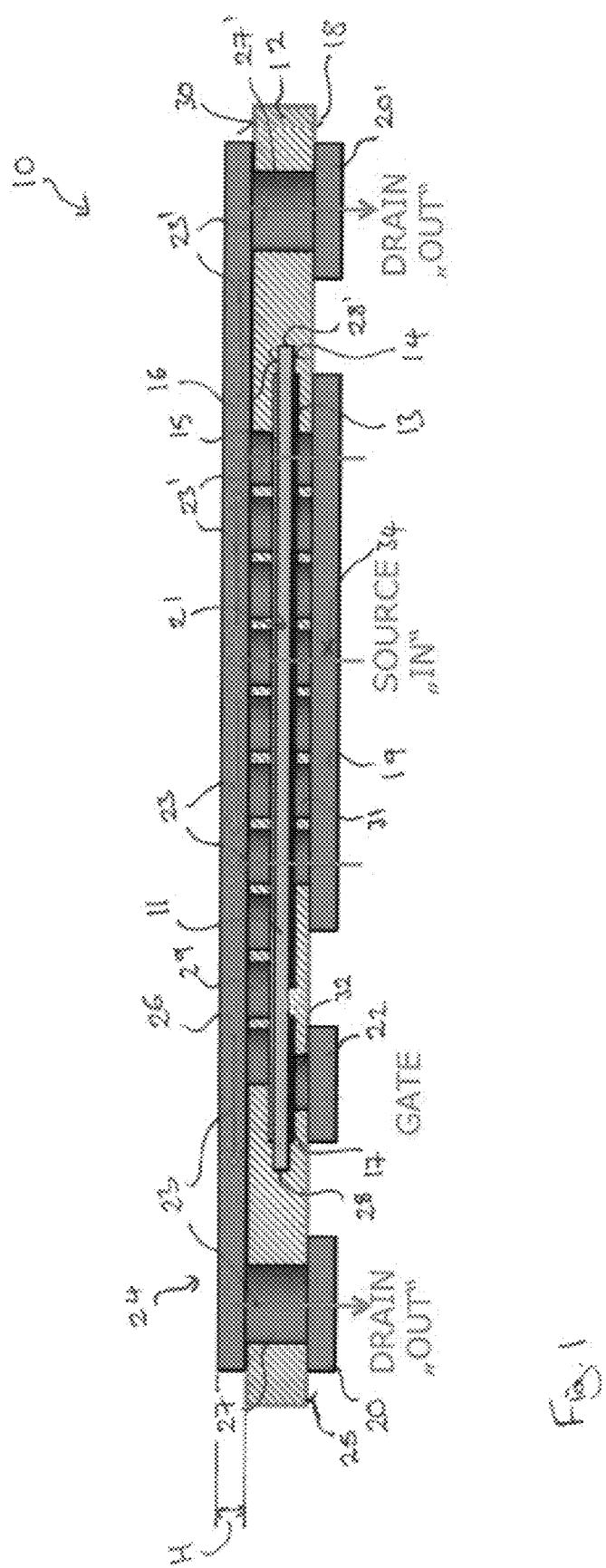

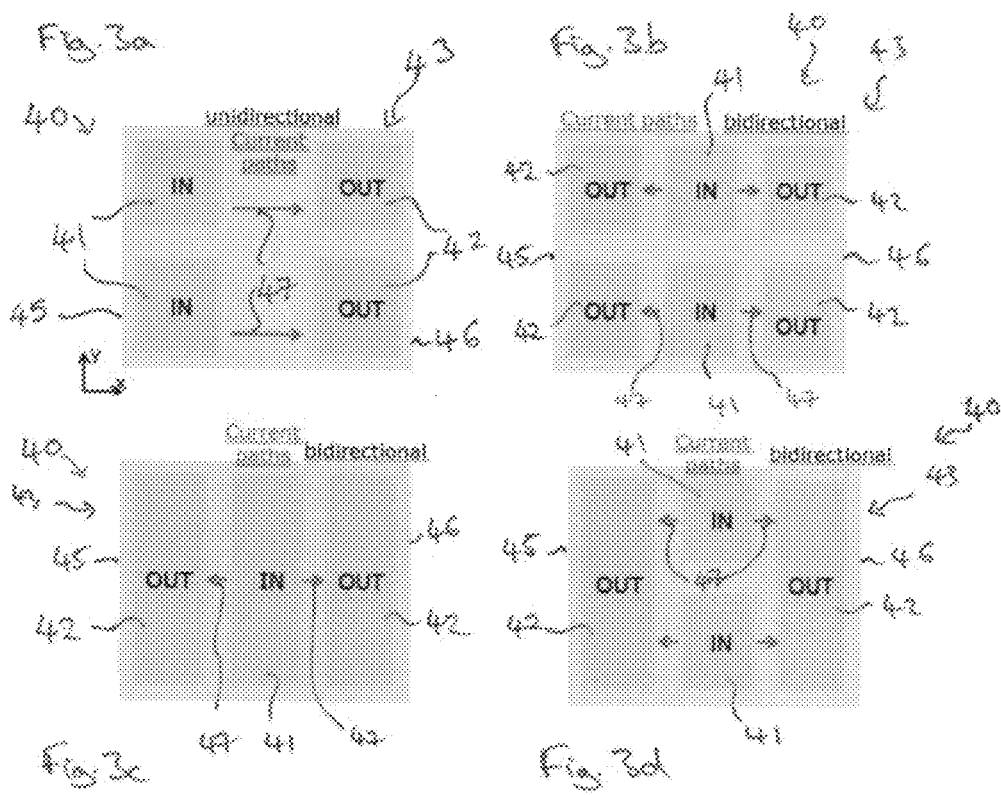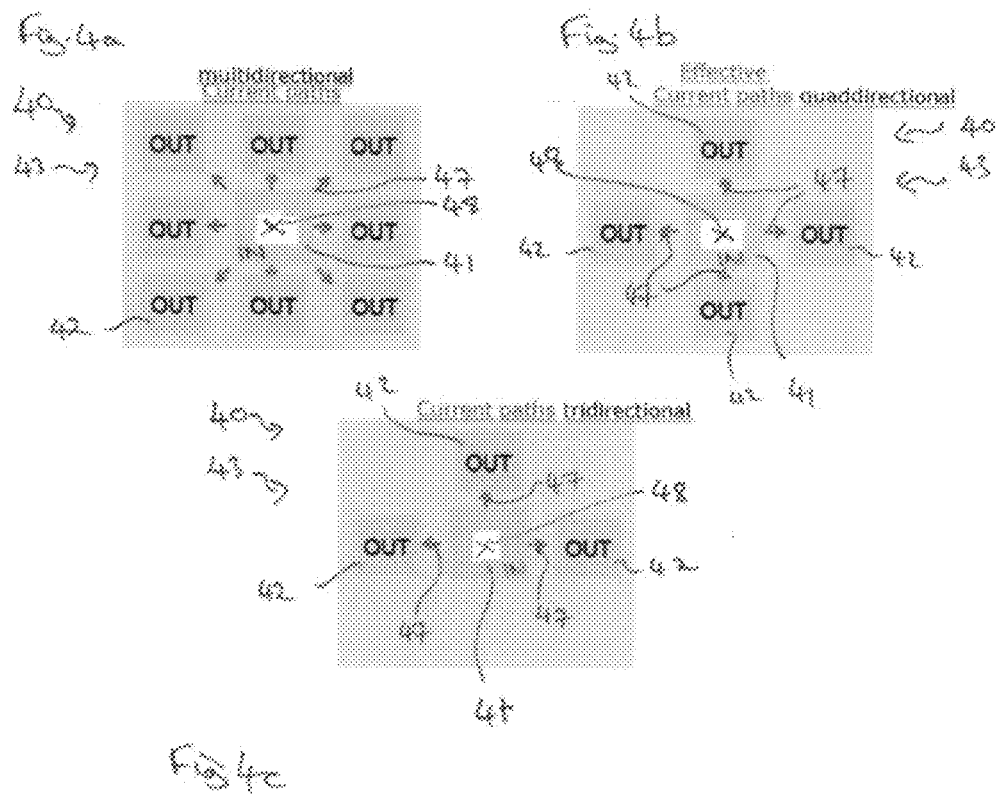

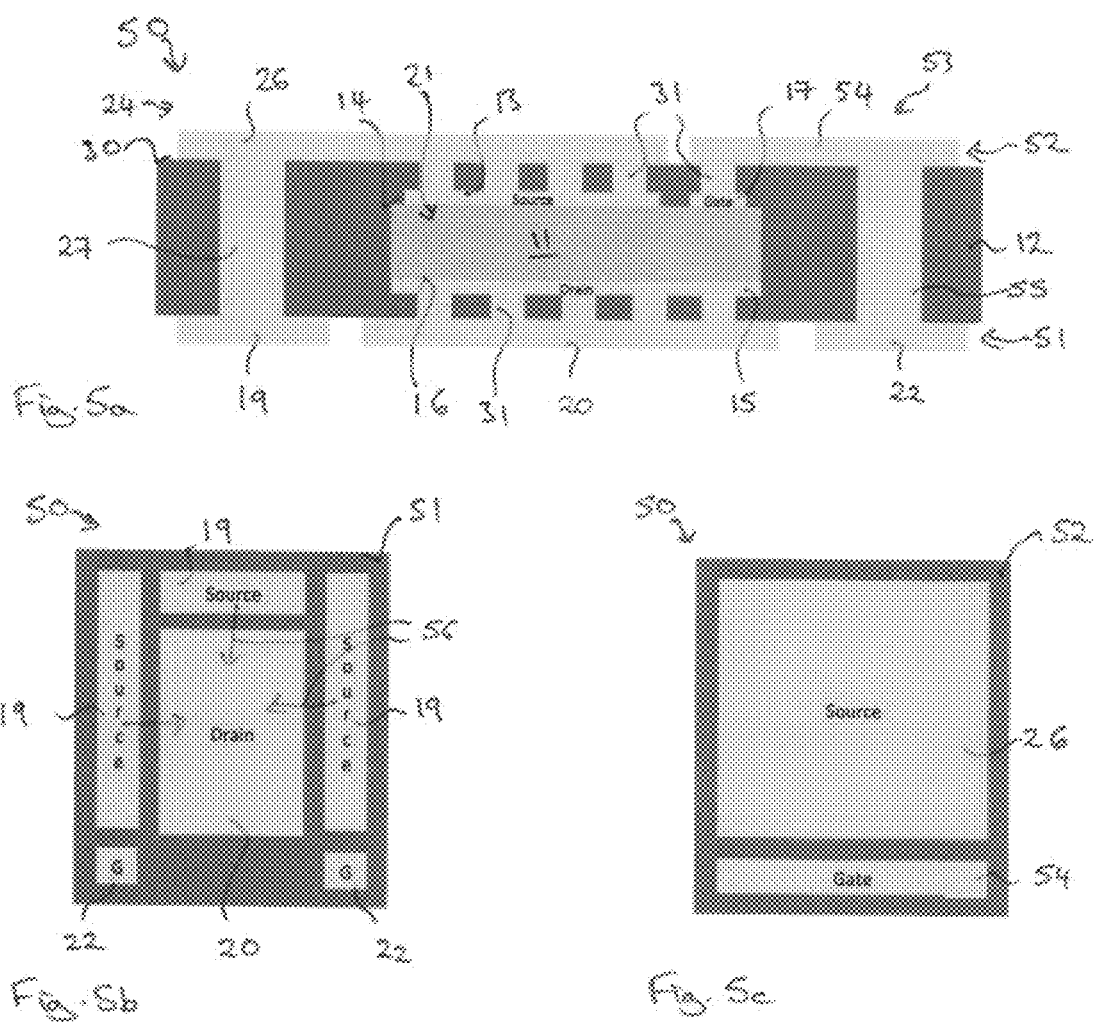

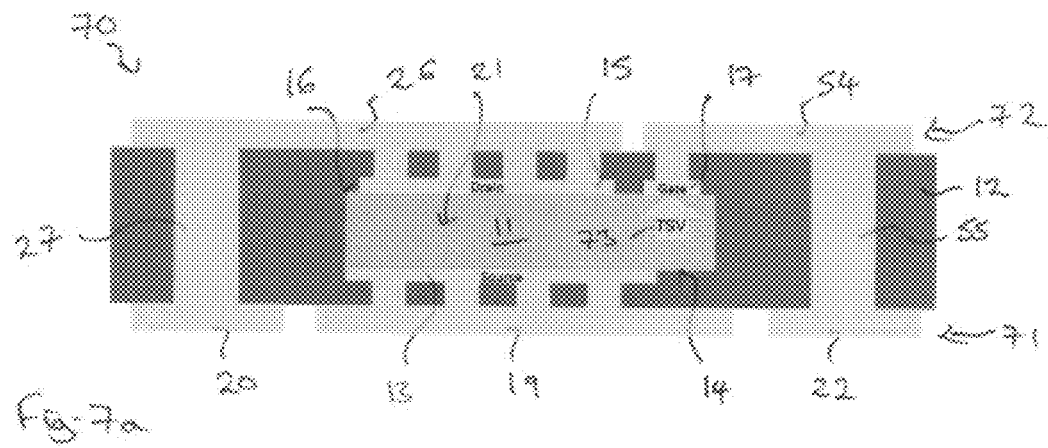
Fig. 7a
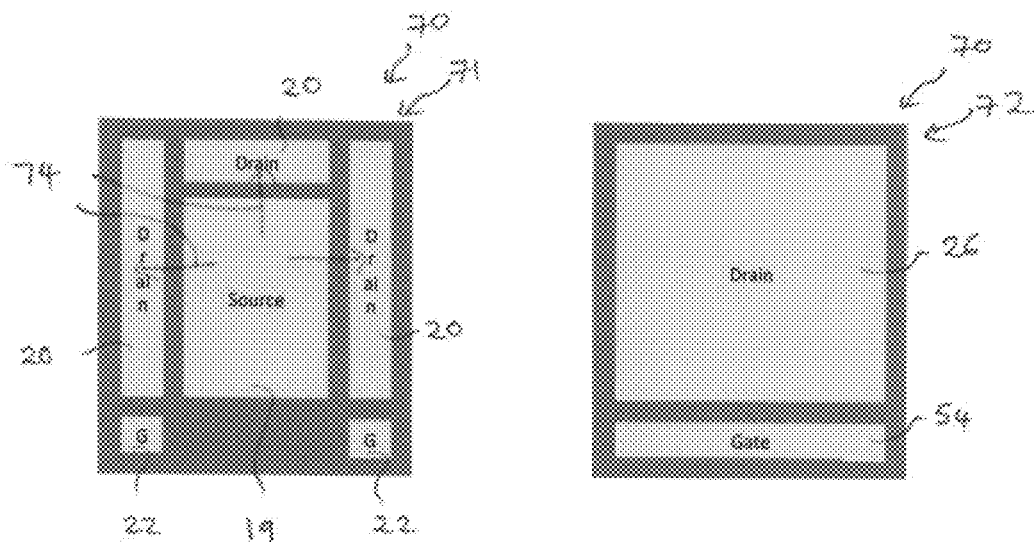
Fig. 7b
Fig. 7c

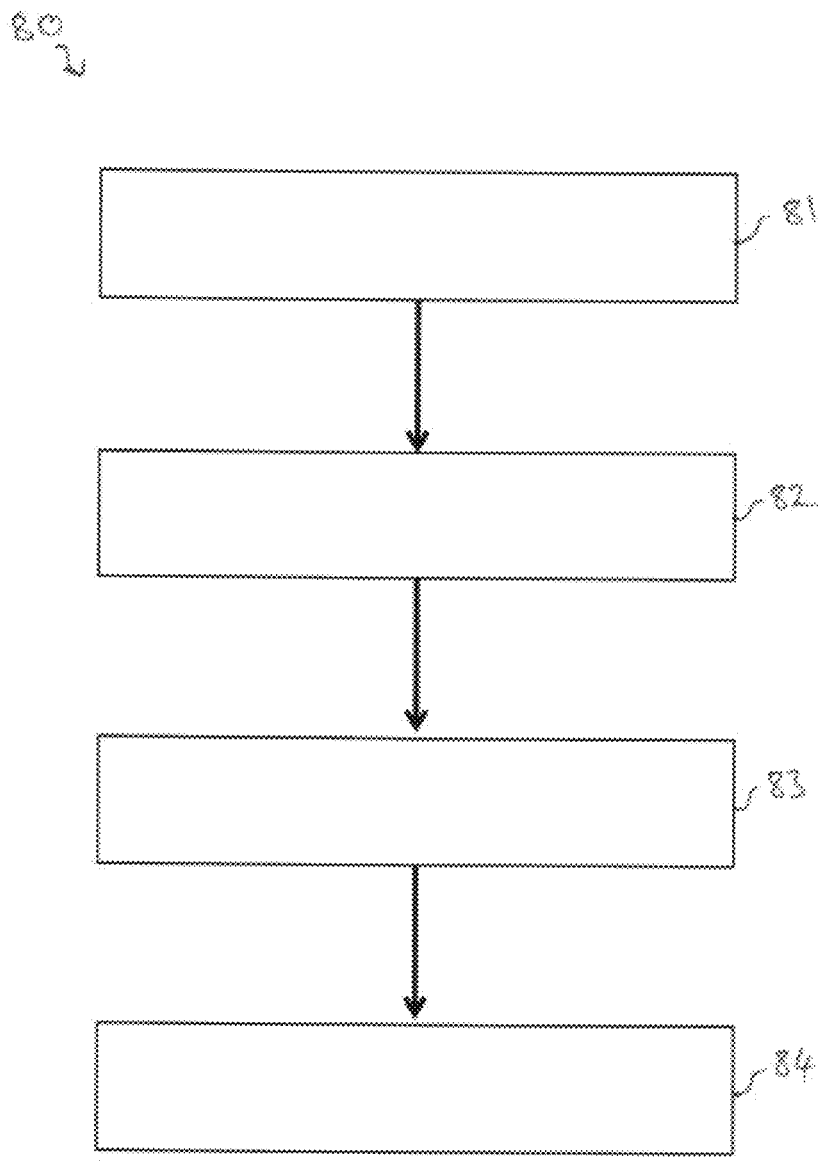

SEMICONDUCTOR PACKAGE AND METHOD OF MANUFACTURING A SEMICONDUCTOR PACKAGE

RELATED APPLICATIONS

This application is a continuation of U.S. patent application Ser. No. 16/287,318, filed on Feb. 27, 2019, and published as US 2019/0267309 A1 on Aug. 29, 2019.

BACKGROUND

An electronic component may include a semiconductor die in a package. The package commonly includes an internal redistribution structure which electrically couples the semiconductor die to a substrate or a leadframe which includes outer contacts. The package commonly includes a housing which covers the semiconductor die and the internal redistribution structure. The housing may include a plastic material, such as epoxy resin, and may be formed by a mold process, such as injection molding. The outer contacts are used to mount the electronic component on a redistribution board, such as a printed circuit board. The geometrical arrangement of the outer contacts may be described as a package footprint.

Packages with good electrical and thermal performance, which can also be cost effectively manufactured, are desirable.

SUMMARY

In an embodiment, a semiconductor package comprises a semiconductor die comprising a semiconductor device, a first contact pad arranged on a first surface of the semiconductor die and a second contact pad arranged on a second surface of the semiconductor die that opposes the first surface. The semiconductor die is embedded in a dielectric layer. The semiconductor package comprises first and second package contact pads arranged on a first major surface of the semiconductor package. The first contact pad of the semiconductor die is coupled to one or more first package contact pads and the second contact pad of the semiconductor die is coupled to one or more second package contact pads. In operation, the semiconductor device causes a current path between the first package contact pads and the second package contact pads. The first and second package contact pads are arranged on the first major surface of the semiconductor package to provide multiple non-parallel current paths between the first and second package contact pads.

In an embodiment, a semiconductor package comprises a semiconductor die comprising a semiconductor device, a first contact pad arranged on a first surface of the semiconductor die and a second contact pad arranged on a second surface of the semiconductor die that opposes the first surface. The semiconductor die is embedded in a dielectric layer. The semiconductor package further comprises a package footprint arranged on a first major surface of the semiconductor package. The package footprint comprises first and second package contact pads. The first contact pad of the semiconductor die is coupled to one or more first package contact pads and the second contact pad of the semiconductor die is coupled to one or more second package contact pads. The semiconductor package further comprises a plurality of first vias extending from the first contact pad to the first package contact pad and a redistribution structure coupling the second contact pad to at least one second package pad arranged on an opposing side of the semiconductor die. The redistribution structure comprises a lateral layer, a plurality of second vias extending between the second contact pad and the lateral layer and one or more package vias arranged adjacent opposing side faces of the semiconductor die. In operation the semiconductor device causes a current to flow between the first package pad and the second package pad, wherein the current is laterally distributed and flows in the lateral layer of the redistribution structure between the second contact pad and the through package vias in two laterally opposing directions.

In an embodiment, a method of fabricating a semiconductor package with a lower package resistance comprises defining an area of a package footprint of a semiconductor package. The semiconductor package comprises a semiconductor die comprising a semiconductor device, a first contact pad arranged on a first surface of the semiconductor die and a second contact pad arranged on a second surface of the semiconductor die that opposes the first surface. The semiconductor die is embedded in a dielectric layer, wherein the package footprint is arranged on a first major surface of the semiconductor package. The package footprint comprises first and second package contact pads, wherein in operation the semiconductor device causes a current to flow between the first package pad and the second package pad. The method further comprises coupling the first contact pad of the semiconductor die to one or more first package contact pads, coupling the second contact pad of the semiconductor die to one or more second package contact pads by a redistribution structure having a lateral portion and a vertical portion and arranging the vertical portion of the redistribution structure adjacent two or more side faces of the semiconductor die to laterally distribute the current flow between the first package contact pad and the second package contact pad in multiple non-parallel paths in the lateral portion of the redistribution structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a cross-sectional view of a semiconductor package according to an embodiment.

FIG. 3A illustrates a schematic plan view of a footprint of a package with a unidirectional current path.

FIGS. 3B to 3D illustrate schematic plan views of various embodiments of footprints for a package with multidirectional current paths.

FIGS. 4A to 4C illustrate schematic plan views of various embodiments of footprints for a package with multidirectional current paths.

FIG. 5A illustrates a cross-sectional view of a semiconductor package.

FIG. 5B illustrates a plan view of the lower side of the semiconductor package of FIG. 5A.

FIG. 5C illustrates a plan view of the top side of the semiconductor package of FIG. 5A.

FIG. 7A illustrates a cross-sectional view of a semiconductor package.

FIG. 7B illustrates a plan view of the lower side of the semiconductor package of FIG. 7A.

FIG. 7C illustrates a plan view of the top side of the semiconductor package of FIG. 7A.

FIG. 8 illustrates a flowchart of a method for fabricating a semiconductor package with a lower package resistance.

DETAILED DESCRIPTION

Figure 2A:
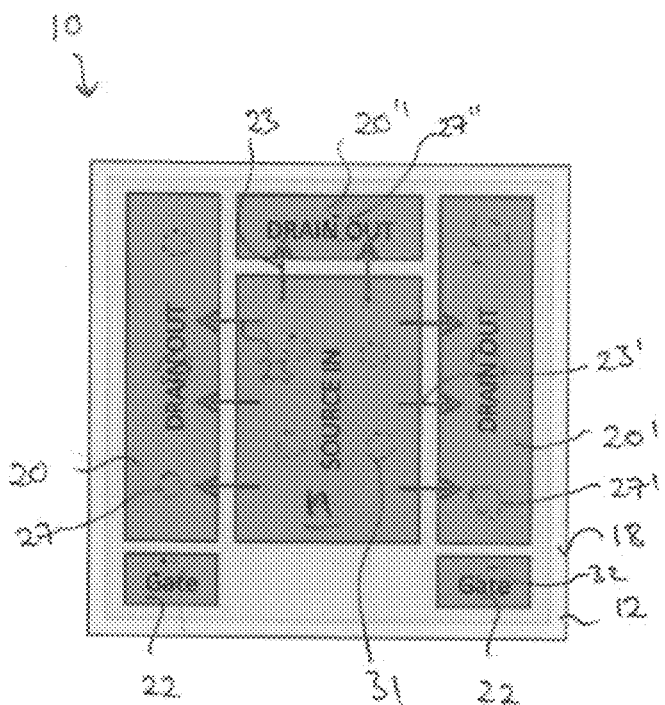
FIG. 2A illustrates a plan view of the lower surface of the semiconductor package of FIG. 1 with a first geometrical arrangement of the package contact pads.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 illustrates a cross-sectional view of a semiconductor package 10. The semiconductor package 10 includes a semiconductor die 11 which is embedded in a dielectric layer 12. A first contact pad 13 is arranged on a first surface 14 of the semiconductor die and a second contact pad 15 is arranged on a second surface 16 of the semiconductor die 11 which opposes the first surface 14. One or more further contact pads may be arranged on one or both of the first surface 14 and the second surface 16 of the semiconductor die 11. In the embodiment illustrated in FIG. 1, a third contact pad 17 is arranged on the first surface 14 which is arranged adjacent and separate from the first contact pad 13.

The semiconductor package 10 further includes package contact pads which are arranged on a first major surface 18 of the semiconductor package 10. The dielectric layer 12 has a lateral extent which is greater than the area occupied by the package contact pads such that the package contact pads 19, 20, 22 are arranged on the lower surface 25 of the dielectric layer 12. The package contact pads provide the outer contacts of the semiconductor package 10. The first contact pad 13 of the semiconductor die 11 is coupled to one or more first contact package contact pads 19 and the second contact pad 15 of the semiconductor die 11 is coupled to one or more second contact pads 20.

The semiconductor die 11 includes a semiconductor device 21 which in operation causes a current path between the first package contact pad or pads 19 and the second package contact pad or pads 20. In the embodiment illustrated in FIG. 1, the semiconductor die 11 includes a transistor device 21, the first contact pad 13 is a source contact pad, the second contact pad 15 is a drain contact pad and the third contact pad 17 is a gate contact pad. The gate contact pad 17 is coupled to a third package contact pad 22. In operation, the transistor device 21 causes a current path between the first contact pad 19 which is coupled to source of the transistor device 21 and the second contact pads 20 which are coupled to drain of the transistor device 21.

The semiconductor device 21 is not limited to a transistor device 21 having contact pads denoted as source, drain and gate as is the case, for example, for MOSFET device. The semiconductor die may also include insulated gate bipolar transistor (IGBT) or a bipolar junction transistor (BJT), for example. In which case, for IGBT devices, the first contact pad may be an emitter pad and the second contact pad may be a collector electrode. For BJT devices, the first contact pad may be an emitter pad, the second contact pad may be a collector contact pad and the third contact pad may be a base contact pad. The first contact package contact pad 19 can be considered to be an "IN" package contact pad and each of the second contact pads 20 can be considered to be an "OUT" package contact pad.

The current path or paths between an "IN" package contact pad and an "OUT" package contact pad denotes the technical current flow direction as well as the opposing physical current flow direction. Consequently, the semiconductor device may be NMOS device, i.e. a n-type or n-channel device, such as a n-type Metal Oxide semiconductor transistor device, or a PMOS device, i.e. a p-type or p-channel device, such as a p-type Metal Oxide semiconductor transistor device.

The first and second contact pads 19, 20 are arranged on the first major surface 18 of the semiconductor package 10 so as to provide multiple current paths between the first and second contact pads 19, 20. The current paths are illustrated in FIG. 1 by the arrows 23. In some embodiments, the current paths are non-parallel.

In the cross-sectional view of the package 10 illustrated in FIG. 1, one second package contact pad 20, 20' is laterally arranged adjacent opposing sides of the first package contact pad 19. Consequently, at least two current paths 23, 23' are formed which extend in opposing lateral directions from the first package contact pad 19 to the package contact pad 20 arranged laterally to the left of the first package contact pad 19 and from the first package contact pad 19 to the package contact pad 20' in arranged laterally to the right of the first package contact pad 19 in the cross-sectional view illustrated in FIG. 1. In some embodiments, the current paths are parallel, but the current flow of the paths is in opposing directions.

The semiconductor package 10 also includes a redistribution structure 24 for electrically coupling the second contact pad 15 arranged on the second major surface 16 of the semiconductor die 11 to the second contact pads 20 which are arranged adjacent the opposing surface of the semiconductor die 11, in particular, on the first major surface 18 of the semiconductor package.

The redistribution structure 24 includes a lateral portion in the form of a lateral redistribution layer 26 and a vertical portion in the form of one or more conductive vias 27. The lateral redistribution layer 26 is coupled to the second contact pad 15 on the semiconductor die 11 and extends substantially parallel to the first surface 14 and second surface 16 of the semiconductor die 11. The lateral redistribution layer 26 is electrically coupled to the second package contact pad 20 by one or more conductive vias 27 which extend through the thickness of the dielectric layer 12 and which are arranged adjacent and spaced apart from a side face 28 of the semiconductor die 11. Similarly, the lateral redistribution layer 26 is electrically coupled to the second contact package contact pad 20' arranged on the opposing side of the first package contact pad 19 by a conductive via 27' which is arranged laterally arranged adjacent and spaced apart from the opposing side face 28' of the semiconductor die 11. The conductive vias 27, 27' may extend substantially perpendicular to the first redistribution layer 26 and the respective second package contact pad 20, 20' and may be considered to the through package vias as they extend through the entire thickness of the dielectric layer 12.

The lateral redistribution layer 26 may be arranged directly on the second contact pad 15. In some embodiments, such as that illustrated in FIG. 1, one or more conductive vias 29 may be arranged between the second contact pad 15 and the lateral redistribution layer 26 so as to space the underside of the lateral redistribution layer 26 from the second contact pad 15. The conductive vias 29 may be embedded within the dielectric layer 12 so that the redistribution layer 26 is arranged on the second major surface 30 of the dielectric layer 12. The conductive vias 29 have individually and collectively a lateral area that is less than the lateral area of the second contact pad 15.

In some embodiments, the first package contact pad 19 may be arranged directly on the first contact pad 13. In some embodiments, such as that illustrated in FIG. 1, one or more conductive vias 31 extend between the first contact pad 13 and the first package contact pad 19 so as to space the package contact pad 19 from the first contact pad 13. The conductive vias 31 are also embedded within the dielectric layer 12 such that the first package contact pad 19 is arranged on the lower surface 18 of the dielectric layer 12.

Similarly, one or more conductive vias 32 are arranged between the third contact pad 17 and the third package contact pad 22.

The dielectric layer 12 may include two or more sublayers which are not illustrated in the drawings. For example, the dielectric layer 12 may include a central layer in which the semiconductor die 11 is embedded. The central layer may have a thickness that is approximately the same as the thickness of the semiconductor die 11. One or more further dielectric layers can be applied to one or more sides of the central layer. The central layer may include a dielectric core layer which comprises a fibre reinforced dielectric board which is coated on two opposing sides by one or more further dielectric layers which may comprise epoxy, for example.

Figure 2B:
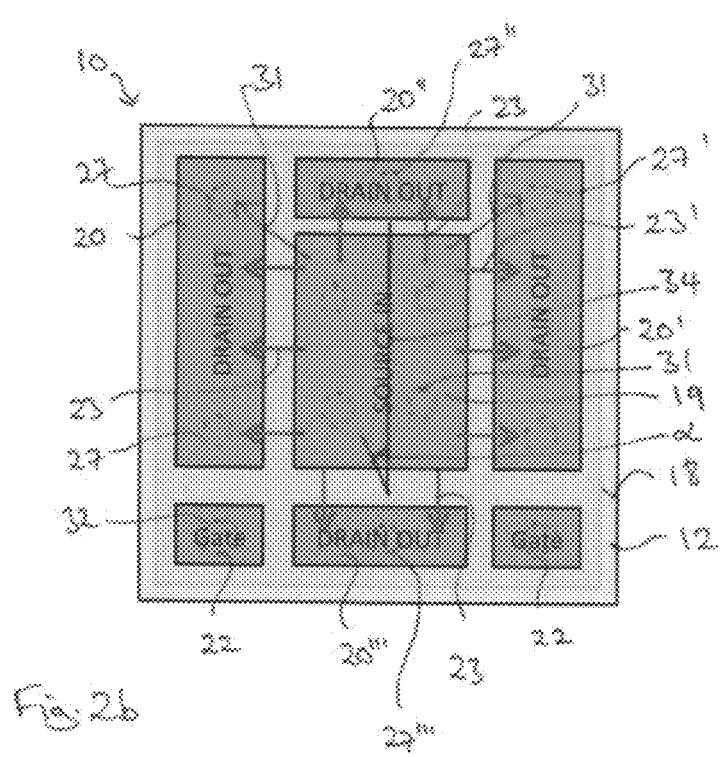
FIG. 2B illustrates a plan view of the lower surface of the semiconductor package of FIG. 1 with a second geometrical arrangement of the package contact pads.
Figure 2C:
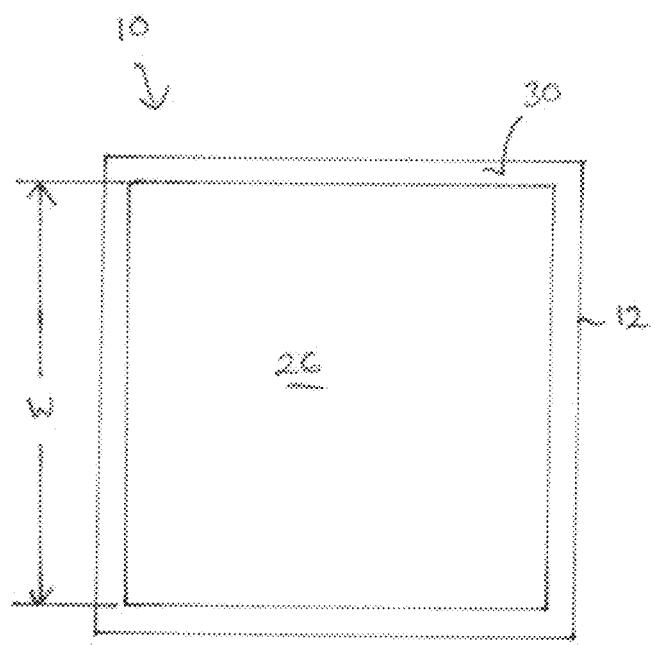
FIG. 2C illustrates a plan view of the top side of the semiconductor package of FIG. 1.

FIGS. 2A and 2B illustrate plan views of the lower surface 18 of the semiconductor package 10 with alternative geometrical arrangements of the package contact pads 19, 20, 22. The arrangement of the package contact pads may be described as the package footprint. FIG. 2C illustrates a pan view of the top surface of the semiconductor package 10.

FIGS. 2A and 2B illustrate multiple nonparallel current paths 23 between the first contact package contact pad or pads 19 and the second package contact pads 20 providing the IN and OUT contacts of the package.

In the embodiment illustrated in FIG. 2A, a single first package contact pad 19 is arranged in approximately the centre of the first major surface 18 of the semiconductor package 10. The first package contact pad 19 is substantially rectangular in plan view. In this embodiment, three second package contacts 20, 20', 20" are provided. One second package contact 20, 20', 20" is laterally arranged adjacent each of three sides of the first package contact pad 19. In other embodiments, a single second package contact 20 may be provided which has a substantially U-shape and is arranged laterally adjacent three sides of the first package contact pad 19. In the embodiment illustrated in FIG. 2A, two third package contact pads 22, 22' are provided which are arranged on opposing lateral sides of the first package contact pad 19 and are aligned with the second package contact pads 20, 20' in a column.

FIG. 2B illustrates a plan view of an alternative arrangement of the second package contact pads 20 with respect to the first package contact pad 19 on the lower surface 18. In the embodiment illustrated in FIG. 2B, one second package contact pad 20, 20', 20", 20'" is arranged adjacent each of the four sides of the first package contact pad 19.

In both arrangements, one or more second contact package contact pads 20 are arranged at two peripheral edges of the footprint that are mutually perpendicular, for example, the second contact pads 20 and 20" are arranged at mutually perpendicular peripheral edges of the footprint and the second contact pads 20' and 20" are arranged at two mutually perpendicular peripheral edges of the footprint.

In operation, current flows through the transistor device 21 from the source to the drain. As is indicated in FIG. 2A by the arrows 23, a current path is formed which extends in multiple nonparallel directions, in particular in three directions, from the first package contact pad 19 to the second package contact pad 20, 20', 20" arranged on three adjoining side faces of the first package contact pad 19. In the embodiment illustrated in FIG. 2B, the current path between the first package contact pad 19 and the four second package contact pads 20 is laterally distributed such that there is a nominal current path in four directions.

Additionally, multiple current paths are formed in the lateral redistribution layer 26 which are also non-parallel due to the arrangement of the second contact pads 20, 20', 20" and conductive vias 27 adjacent more than one side of the second contact pad 15 on the semiconductor die 11.

In embodiments in which the redistribution structure 24 of the package 10 includes a lateral portion 26 and a vertical portion 27, the vertical portion 27 may be provided by one or more conductive vias 27 which extend substantially perpendicular to the lateral portion 26 and the respective second package contact pad. These conductive vias 27 may be considered as through package vias.

The through package vias 27 are arranged adjacent and spaced apart from the side faces 28, 28' of the semiconductor die 11 and also extend substantially parallel to the side faces 28, 28' of the semiconductor die 11 and substantially perpendicular to the first and second surfaces 14, 16 of the semiconductor die 11. The conductive vias 27 have a geometrical arrangement conforming to the geometrical arrangement of the package contact pads. For example, in the embodiment illustrated in FIG. 2A, the through package vias are arranged at three peripheral edges of the footprint underneath the package contact pads 20, 20', 20".

The second contact pad 15 has a lateral axis 34 which in the cross-sectional view of FIG. 1 extends into the plane of the drawing. This lateral axis 34 is perpendicular to the direction of current flow in the current paths indicated by the arrows 23, 23' within the lateral portion 26 of the redistribution structure 24 and is also substantially perpendicular to the direction of current flow within the semiconductor device 22 and to the current flow within the conductive vias 27, 27'.

The through package conductive vias 27, 27' may be arranged with respect to the edges of the semiconductor die 11 such that a current path 23, 23' formed in the lateral redistribution layer 26 is formed at an angle alpha, α, with respect to the lateral axis which is greater or equal to 0° and less than 90°. For example, one or more current paths may be formed which extend into the plane of the drawing, such that alpha is 0° or 180° as is the case for the second package contact pads 20'", 20'" illustrated in FIGS. 2A and 2B, for example. Current paths having an angle alpha, α, to the lateral axis 34 of between 0° and 90° may also be formed, for example, between the first contact pad 19 and peripheral edge regions of the footprint, as indicated in FIG. 2B by the arrows 31, if at least one conductive via 27 is arranged at such an angle alpha with respect to the lateral axis.

FIG. 2C illustrates a plan view of the top side of the semiconductor package 10 and illustrates the lateral redistribution layer 26 on the top surface of the dielectric layer 12. In some embodiments, the lateral redistribution layer 26 may be covered by a further insulating layer.

The lateral redistribution layer 26 has a width W and thickness H. The performance of the package can be improved by designing the package to increase the effective cross-sectional area of this lateral redistribution layer 26. The one or more through package vias 27 can be arranged with respect to the edges of the second contact pad 15 on the semiconductor die 11 such that the effective cross-sectional area of the lateral current path from the second contact pad 19 to the second package pads 20 is greater than the nominal cross-sectional area of the lateral redistribution layer defined as the thickness H of the lateral layer multiplied by the width W of the lateral layer. The effective cross-sectional area can be increased by arranging one or more through package vias 27 adjacent two or more edges of the second contact pad 15 of the semiconductor die 11, for example, adjacent opposing edges, adjacent two mutually perpendicular edges, or adjacent three or four edges of the second contact pad 15 and semiconductor die 11.

The arrangement of the first and second package contact pads is not limited to those arrangements illustrated in FIGS. 2A and 2B. FIGS. 3A-3D and 4A-4C illustrate embodiments alternative arrangements of the first and second package contact pads. In FIGS. 3A-3D and 4A-4C, the first package contact pads are indicated with "IN" and the second contact package contact pads are indicated with "OUT". In these figures, one or more further package contact pads, for example a gate package contact pad, may be present, but are not illustrated.

FIG. 3A illustrates a comparison example of a package 40 which includes two first package contact pads 41 and two second contact pads 42 in the footprint 43 of the semiconductor package 40. The two first package contact pads 41 are arranged adjacent a first peripheral edge 45 of the footprint 43 and the two second package contact pads 42 are arranged adjacent an opposing peripheral edge 46 of the footprint 43. The two first package contact pads 41 can be considered to be arranged in a column and the two second contact pads 42 may be considered to be arranged in a column. In the embodiment illustrated in FIG. 3A, the current paths are indicated with the arrows 47 which illustrates that the package 40 has a unidirectional current path from left to the right.

With this kind of footprint pad arrangement, the current flow in x-y-plane is basically unidirectional e.g. in x-axis, in the lateral redistribution layer 26 of the package.

The resistance of the redistribution layer 26 can be approximated as:

$$R_{unidirectional} = \frac{\rho * l}{ECS}$$

Where l is the current path length that depends on pad positions, ρ is resistivity of the layer material, and ECS is an effective cross section of the layer.

In a simplest case of uni-directional flow, the Effective Cross Section (ESC) can be approximately expressed as product of parameters H (thickness of the layer) and W (width of the layer).

The ECS is determined by geometrical parameters (thickness H and width W) of the layer only in a simplest case of uni-directional current flow, i.e.

$$ESC\ area = H*D = H*W$$

In real cases, the width over which the current is carried, D, (and, consequently ECS) depends on distribution of the current density in the lateral redistribution layer. Parameters H and W in both cases are the same. However, the value of D is reduced due to a smaller size of the IN and OUT pads which increases the layer resistance.

FIG. 3B illustrates an embodiment in which two first package contact pads 41 are arranged towards the centre of the footprint 43 and four second package contact pads 42 are provided, two adjacent the peripheral edge 45 and two adjacent the opposing peripheral edge 46 of the footprint 43 such that each first package contact pads 41 are arranged between two second package contact pads 42. In the embodiment illustrated in FIG. 3B, bidirectional current paths, i.e. current paths in opposing directions, are formed between the central first package contact pad 41 and the outwardly arranged second contact package contact pads 42 arranged laterally adjacent opposing edges of the first package contact pad 41 as indicated by arrows 47.

The current flow in x-y-plane is bidirectional. The resistance of the lateral redistribution layer that connecting the pads IN & OUT while keeping the same package size, can be approximated as:

$$R_{bidirectional} \approx \frac{\rho * \frac{l}{2}}{ECS * 2} \approx \frac{R_{unidirectional}}{4}$$

The arrangement of package footprint pads determines the lengths of current paths to some degree and the size of the pads. The pads are arranged in such a way that the current paths are shorter and the effective cross-section areas in the conducting layers connecting the pads of different electrical potential are larger.

Based on the example of a package with a MOSFET device, the footprint can be additionally optimized to promote an optimized connection (e.g. multiple μvias or via arrays) between source pad of the chip (top) and source pad of the package, where the chip source pad is contacted by vias in all areas with a high current density/load.

FIG. 3C illustrates another package 40 with a footprint 43 including bidirectional current paths. In this embodiment, a single first package contact pad 41 is arranged towards the centre of the footprint 43 and a single second package contact pad 42 is arranged adjacent two opposing edges of the first package contact pad 41 to provide a current path in two opposing directions, as indicated by arrows 47.

FIG. 3D illustrates a further embodiment of a package 40 with bidirectional current paths 47 in which two first package contact pads 41 are arranged in a column towards the centre of the footprint 43 and one second contact package contact pad 42 is arranged on two opposing sides of the column of first package contact pads 41.

FIGS. 4A-4C illustrate schematic plan views of various embodiments of footprint 43 with multidirectional current paths in which the current paths 47 have current directions with relative angles of between greater than 0° and less than 180°.

FIG. 4A illustrates a footprint 43 having a single first package contact pad 41 arranged in the centre of the footprint 43 and eight second contact pads 42 arranged at the four peripheral edges of the footprint 43 such that a column of three second package contact pads 42 is arranged adjacent each peripheral edge of the package footprint 43. Such an arrangement may be used to provide current paths which extend around 360° with respect to an axis 48 of the footprint 43 which extends into the plane of the drawing and substantially perpendicular to the centre of the footprint 43.

FIG. 4B illustrates an embodiment of a package 40 in which a single first package contact pad 41 is arranged in the lateral centre of the footprint 43 and four second package contact pads 42 are provided which are arranged adjacent and laterally spaced apart from four side faces of the first package contact pad 41. This arrangement provides four effective current paths 47 extending at nominal angles of 0°, 90°, 180°, 270° with respect to the axis 48 of the footprint 43.

FIG. 4C illustrates an embodiment of a package 40 including one first package contact pad 41 arranged at approximately the lateral centre of the footprint 43 and three second package contact pads 42. One second package contact pad 42 is arranged adjacent three sides of the first package contact pad 41 and provides a nominally tridirectional current path 47.

The arrangements of the first and second package contact pads in the footprint of the package according to any one of the embodiments described herein may usefully be applied to packages fabricated using chip embedding techniques. In some chip embedding techniques, the semiconductor device or chip is embedded in a dielectric or insulating layer, for example a fibre-reinforced epoxy layer, and, afterwards, the conductive redistribution structure including the package contact pads is applied or built up on the dielectric layer and embedded semiconductor device. Chip embedding techniques may be used to produce thin packages with a small lateral area. Thermal dissipation from such thin packages with a small lateral area can be improved by reducing the package resistance.

FIGS. 5A-5C illustrate a semiconductor package 50 according to a further embodiment, wherein FIG. 5A illustrates a cross-sectional view, FIG. 5B a plan view of the lower side 51 and FIG. 5C a plan view of the upper side 52 of the semiconductor package 50.

Semiconductor package 50 includes a semiconductor die 11 embedded in a dielectric layer 12. The semiconductor die 11 includes a transistor device 21 which includes a source pad 13 and a gate pad 17 on the first surface 14 and a drain pad 15 on the opposing second surface 16 of the semiconductor die 11 as in the embodiment illustrated in FIG. 1. The embodiment illustrated in FIGS. 5A-5C differs from that illustrated in FIG. 1 in the orientation of the first surface 14 of the semiconductor die 11 in relation to the package contact pads 19, 20, 22 of the semiconductor package 50. In the embodiment illustrated in FIGS. 5A-5C, the semiconductor die 11 has the inverse orientation or flipped orientation so that the first surface 14 of the semiconductor die 11 including the source pad 13 and the gate pad 17 faces upwardly away from the package contact pads 19, 20, 22 and the drain contact pad 15 on the second surface 16 of the semiconductor die 11 faces downwardly towards the package contact pads 19, 20, 22.

The drain contact pad 15 is mounted on a single second contact pad 20 by means of conductive vias 31. The upwardly facing source contact pad 13 is electrically coupled to the first package contact pads 19 arranged on the opposing side of the dielectric layer 12 by the redistribution structure 24 including the lateral redistribution layer 26 which is positioned on the upper surface 30 of the dielectric layer 12 and conductive vias 27 which extend through the entire thickness of the dielectric layer 12 and electrically couple the lateral layer 26 with the first package contact pad 19.

In this embodiment, the gate pad 17 faces upwardly and is electrically coupled to a package contact pad 22 arranged on the opposing side of the semiconductor die 11 by a second redistribution structure 53 comprising a lateral portion 54 and a vertical portion 55. The lateral portion 54 is provided by a lateral conductive layer 54 which is positioned on the upper surface 30 of the dielectric layer 12 and is electrically coupled by one or more conductive vias 55 which extend through the dielectric layer 12 from the upper surface 52 to the lower surface 51 of the semiconductor package 50. The conductive via or vias 55 extend between the lateral portion 54 of the redistribution structure 53 and the contact pad 22. In embodiments in which the first surface 14 is positioned within the dielectric layer 12, one or more conductive vias 31 may also be positioned between the source contact pad 13 and the lateral layer 26 and between the gate contact pad 17 and the lateral layer 54.

FIG. 5C illustrates a plan view of the top side 52 of the semiconductor package 50 and illustrates that the lateral layer 54 has a substantially strip-like shape which is positioned at one peripheral edge of the upper side 52. The lateral portion 26 may extend over substantially the remainder of the upper side 52. The geometrical position of the package contact pads 19, 20, 22 at the bottom side 51 of the package 50 is illustrated in plan view of FIG. 5B.

The second package contact pad 20 which is coupled to drain is positioned in approximately the lateral centre of the lower side 51. Three first package contact pads 19 are provided which are arranged on laterally adjacent three sides of the second package contact 20. In this embodiment, two third package contact pads 22, which are coupled to the gate contact pad 17, are provided. The third package contact pads 22 are positioned in two edge regions of the lower side 51 such that each forms a column with one of the first package contact pads 19. The package 50 can be considered to have multiple nonparallel current paths 56 extending from each of the first package contact pads 19 to the second package contact pad 20, as indicated by the arrows 56 in FIG. 5B.

Figure 6A:
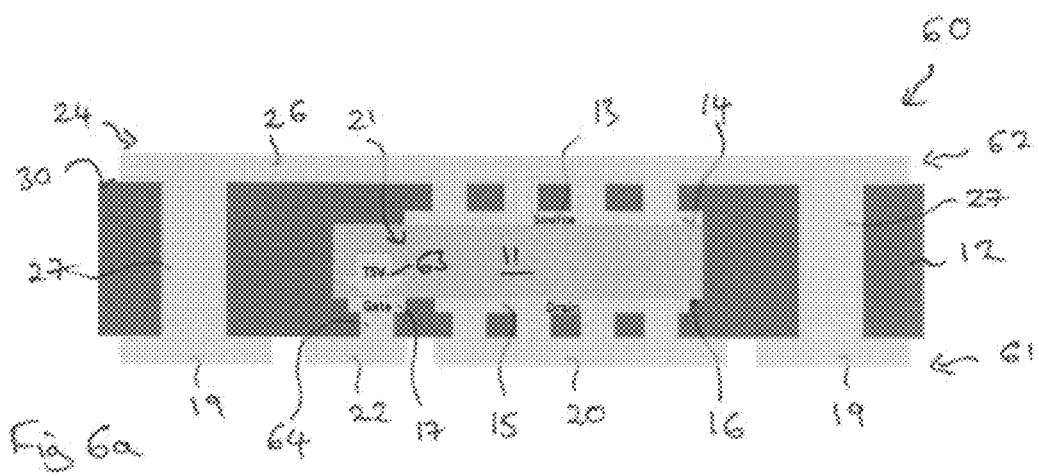
FIG. 6A illustrates a cross-sectional view of a semiconductor package.
Figure 6B:
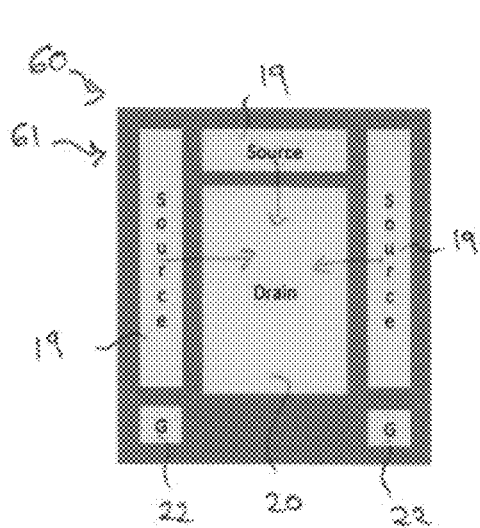
FIG. 6B illustrates a plan view of the lower side of the semiconductor package of FIG. 6A.
Figure 6C:
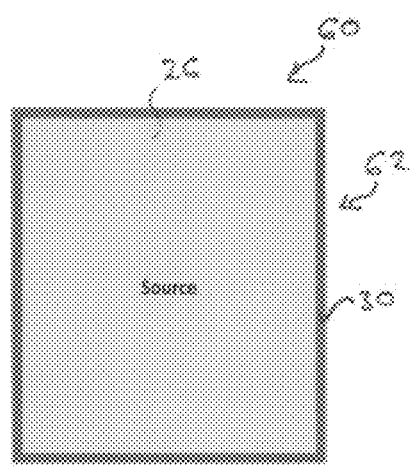
FIG. 6C illustrates a plan view of the top side of the semiconductor package of FIG. 6A.

FIGS. 6A-6C illustrate a semiconductor package 60 according to an embodiment, wherein FIG. 6A illustrates a cross-sectional view, FIG. 6B a plan view of the lower side 61 and FIG. 6C plan view of the upper side 62 of the semiconductor package 60.

The semiconductor package 60 includes a semiconductor die 11 including a transistor 21 whereby the semiconductor die 11 is embedded in a dielectric layer 12 and the lower side 61 includes package contact pads 19, 20, 22 having the geometrical arrangement illustrated in FIG. 5B. The semiconductor die 11 is orientated within the semiconductor die 12 with respect to the lower side 61 of the package 60 as in the embodiment illustrated in FIGS. 5A-5C. The source contact pad 13 is arranged on the first surface 14 of the semiconductor die 11 and faces upwardly away from the outer package contact pads 19, 20, 22. The drain contact pad 15 is arranged on the opposing surface 16 of the semiconductor die 11 faces towards the lower side 61 of the package 60 and the package contact pads 19, 20, 21.

The arrangement of the package contact pads 19, 20, 22 is, in the embodiment illustrated in FIG. 6B, the same as that illustrated in FIG. 5B. However, in contrast to FIG. 5B, in the embodiment illustrated in FIG. 6B, the gate contact pad 17 is arranged on the second surface 16 of the semiconductor die 11 and is positioned laterally adjacent the drain contact pad 15. The gate structure of the of the transistor device 21 may be modified such that it is electrically coupled by one or more through silicon vias 63 to the gate pad 17 arranged on the opposing second surface 16 of the semiconductor die 11.

In the embodiment illustrated in FIG. 6C, the lateral redistribution layer 26 which is electrically coupled to the source pad 13 may extend over substantially the entire top surface 30 of the dielectric layer 12. The gate contact pad 17 is coupled to the third package contact pad 22 by a conductive via 64.

FIG. 7A illustrates a semiconductor package 70 including a lower side 71 and upper side 72, whereby FIG. 7A illustrates a cross-sectional view, 7B a plan view of the lower side 71 and FIG. 7C a plan view of the top side 72 of the package 70.

The geometrical arrangement of the conductive portions providing the lateral redistribution layers 26 and 54 on the top surface 72 and the package contact pads 19, 20, 22 corresponds to that illustrated in FIG. 5B. The orientation of the semiconductor die 11 and the transistor device 21 within the dielectric layer 12 and consequently with respect to the lower side 71 and upper side 72 of the semiconductor package 70 is reversed compared to the embodiment illustrated in FIG. 5A. Compared to the embodiment illustrated in FIG. 6A, the semiconductor die 11 has the reverse orientation such that the source pad 13 faces downwardly towards the package contact pads 19, 20, 21 and the drain pad 15 and gate pad 17 face upwardly.

In the embodiment illustrated in FIGS. 7A-7C, the second side 16 of the semiconductor die with the drain contact pad 15 faces upwardly towards the upper side 72 of the package 70 and away from the package contact pads 19, 20, 22. The source pad 13 is arranged on the opposing surface 14 of the semiconductor die 11 and faces towards the lower side 71 of the package 70 and the package contact pads 19, 20, 22. In this embodiment, the gate contact pad 17 is arranged on the second surface 16 of the semiconductor die 11 and laterally adjacent the drain pad 15 as in the embodiment illustrated in FIG. 6A. In this embodiment, the semiconductor die 11 includes a through silicon via 73 to couple the gates of the transistor structure 21 to the gate pad 17.

This arrangement has the effect that the assignment of the conductive portions of the redistribution structure 24 and the first and second package contact pads 19, 20 is reversed over that illustrated in FIG. 5B. In contrast to the embodiment illustrated in FIGS. 5B and 5C, the redistribution layer 26 is coupled to the drain contact and the central package contact pad in the footprint is a first package contact pad 19 which is coupled to source or generically "IN" and the outer three package contact pads are second contact pads 20 coupled to drain or generically "OUT". This arrangement also provides multiple current paths 74 which are nonparallel. Due to the arrangement of the three second package contact pads 20 laterally adjacent three edges of the first package contact pad 19, a current path 74 is formed in the opposing direction to that illustrated in FIG. 5B but also in at least two mutually perpendicular directions.

FIG. 8 illustrates a flowchart 80 of a method for fabricating a semiconductor package with a lower package resistance. The method includes, in block 81, defining an area of the package footprint of a semiconductor package. The semiconductor package comprises a semiconductor die comprising a semiconductor device, for example a transistor device, a first contact pad arranged on a first surface of the semiconductor die and a second contact pad arranged on the second surface of the semiconductor die, the second surface opposing the first surface. The semiconductor die is embedded in a dielectric layer. The package footprint is arranged on a first major surface of the semiconductor package and comprises first and second package contact pads. In operation, the semiconductor device causes a current flow between the first package contact pad and the second package contact pad.

In block 82, the first contact pad of the semiconductor die is coupled to one or more first package contact pads. In block 83, the second contact pad of the semiconductor die is coupled to one or more second package contact pads by a redistribution structure having a lateral portion and a vertical portion.

In block 84, the vertical portion of the redistribution structure is arranged adjacent two or more side faces of the semiconductor die so as to laterally distribute the current flow between the first package contact pad and the second package contact pad in multiple nonparallel paths in the lateral portion of the redistribution structure.

In some embodiments, the second package contact pads may be arranged laterally adjacent two or more adjoining side faces of the semiconductor die, thus increasing the effective current carrying cross-sectional area of the lateral portion of the redistribution structure. By arranging the second package contact pads in the package footprint laterally adjacent two or more adjoining side faces of the semiconductor die, a current path is produced within the lateral portion of the redistribution structure which extends in at least two substantially perpendicular directions and therefore in multiple nonparallel paths. This increases the effective current carrying cross-sectional area of the lateral portion of the redistribution structure and, therefore, reduces the package resistance over an arrangement in which the second package contact pads are arranged laterally adjacent a single side face of the semiconductor die.

In some embodiments, the method further comprises reducing a length of a line of sight path between the first package contact pad and the second package contact pad in the package footprint. The length of the line of sight path may be reduced by splitting at least one of the first package contact pad and the second package contact pad into two or more portions whilst the area of the package footprint remains the same.

For example, in the case of one first package contact pad and one second package contact pad, the package footprint may give rise to a semiconductor package having a certain package resistance. The length of line of sight path between the first package contact pad and the second package contact pad in the package footprint is at least in part defined by the area of the package footprint. If, for example, the second package contact pad is split to provide two second package contact pads, the length line of sight between the first package contact pad and each of the second package contact pads may be reduced by rearranging the first package contact pad and the two second package contact pads in the package footprint, for example by arranging one of the second package contact pads laterally adjacent two opposing edges of the first package contact pad. Since the area of the package footprint remains the same, the length of a line of sight path between the first package contact pad and one of the second package contact pads can be reduced, thus reducing the package resistance and inductance.

The package resistance ($R_{DS(on)}$) can be reduced by using one or more of the principles for the arrangement of the foot print layout and package design described herein.

Based on simulations, the package resistance in Chip embedding packages can be minimized by maximizing the "effective cross-section" of the current path. The effective cross-section of the lateral conducting layers in the package can be maximized by placing the pads along several sides of the package outline, for example. This leads to reduced ohmic losses.

Figure 9A:
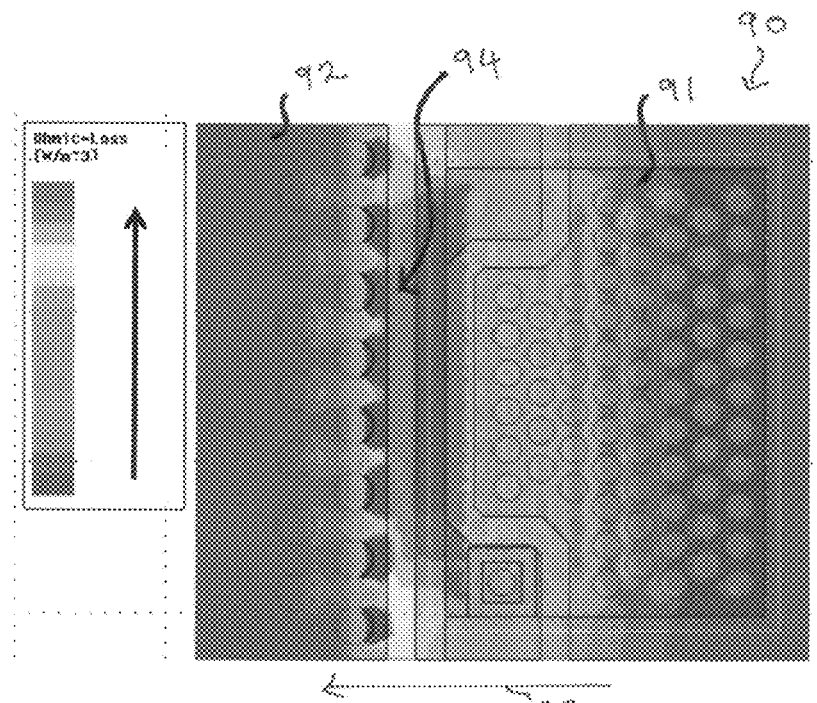
FIG. 9A illustrates simulated ohmic losses for a package with unidirectional current flow.
Figure 9B:
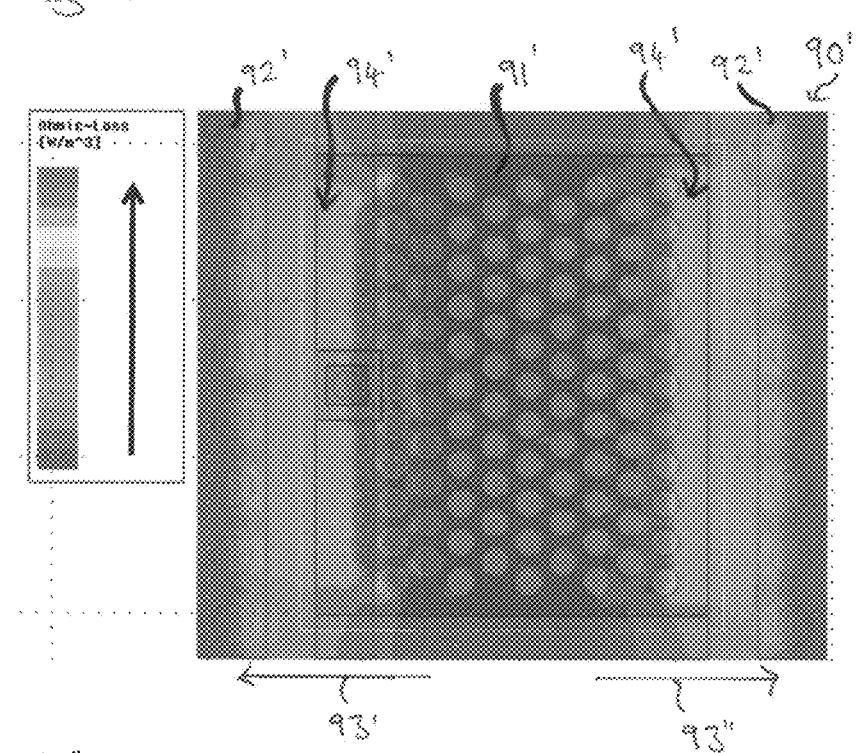
FIG. 9B illustrates simulated ohmic losses for a package with bidirectional current flow.

FIG. 9A illustrates simulated ohmic losses for an example package 90 with unidirectional current flow and FIG. 9B illustrates simulated ohmic losses for an example package 90' with bidirectional current flow.

The example package 90 includes a first package contact pad 91 and a second package contact pad 92 arranged laterally adjacent one another such that the package 90 has a unidirectional current path 93. The simulated ohmic losses show a peak in the region 94.

The example package 90' includes a first package contact pad 91' and two second package contact pads 92' that are arranged laterally adjacent opposing sides of the first package contact pad 91' such that the package 90' has current paths 93', 93" in opposing directions and, therefore, bidirectional current paths. The simulated ohmic losses show ohmic losses in the regions 94' and 94' which are less than the simulated ohmic losses for the package 90 with a unidirectional current path.

By using multidirectional current flow and optimized package footprint design instead of a unidirectional current path configuration, an optimized package footprint, layer structure and die design, the package resistance can be reduced by even 60-70%. Simulations have indicated that the package resistance can be reduced to 50 to 60 µOhm for tri-directional embodiments or 43 µOhm for tetra-directional embodiments.

To summarize, the configuration of the package contact pads coupled to the source and drain pads of the transistor device, is selected so that the current flow in the package, in particular in the lateral layer of the redistribution structure, is more homogeneous and the package resistance and also the inductance is reduced.

A combination of two or more of the following factors may be used:

multi-directional current flow increases an effective cross section area in the lateral redistribution layer by the factor of 2 as compared with a uni-directional arrangement;

multi-directional current flow significantly reduces DC resistance of the package since 50-70% of total losses in the package is believed to take place in the lateral redistribution layer that is coupled to drain;

the configuration of the pads enables shorter current path between drain and source as compared with the unidirectional arrangement and proportionally reduces DC resistance of the package;

thermal performance is improved the peak values of the current density, Ohmic losses and, consequently, temperature are lower in the packages employing multi-directional flows, thus reducing risk of over-heating during passage of high currents;

the multi-directional flow package design may have a symmetrical footprint that provides more freedom for users to design and mount the components on to a PCB.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a semiconductor die comprising a semiconductor device, a first contact pad arranged on a first surface of the semiconductor die and a second contact pad arranged on a second surface of the semiconductor die that opposes the first surface, the semiconductor die being embedded in a dielectric layer; and
one or more first package contact pads and one or more second package contact pads arranged on a first major surface of the dielectric layer, wherein the dielectric layer has a lateral extent that is greater than the area occupied by the first and second package contact pads, the first contact pad of the semiconductor die being coupled to the one or more first package contact pads and the second contact pad of the semiconductor die being coupled to the one or more second package contact pads,
wherein in operation, the semiconductor device causes a current path between the first contact pad and the second contact pad,
wherein the one or more first package contact pads and the one or more second package contact pads are arranged on the first major surface of the dielectric layer to provide multiple non-parallel current paths between the one or more first package contact pads and the one or more second package contact pads.

2. The semiconductor package of claim 1, wherein the first contact pad is a source contact pad, wherein the second contact pad is a drain contact pad, and wherein two or more of the second package contact pads are arranged on the first major surface of the dielectric layer and laterally adjacent three or more sides of a first package contact pad of the one or more first package contact pads.

3. The semiconductor package of claim 1, wherein one of the second package contact pads is arranged on the first major surface of the dielectric layer at a first peripheral edge of a footprint and the second package contact pad is arranged on the first major surface of the dielectric layer at a second peripheral edge of the footprint, the first and second peripheral edges of the footprint being mutually perpendicular, or wherein one of the second package contact pads is arranged on the first major surface of the dielectric layer at three or four peripheral edges of the footprint, and wherein the footprint is an arrangement of the first and second contact pads on the first major surface of the dielectric layer.

4. The semiconductor package of claim 1, further comprising through package vias that extend through the dielectric layer and are arranged at two peripheral edges of a footprint that are mutually perpendicular, or arranged at three or four peripheral edges of the footprint, and wherein the footprint is an arrangement of the first and second contact pads at the first major surface.

5. The semiconductor package of claim 1, further comprising a redistribution structure, wherein a lateral portion of the redistribution structure comprises a lateral layer coupled to the second contact pad, and wherein a vertical portion of the redistribution structure comprises one or more through package vias extending through the dielectric layer between the lateral layer and the one or more second package contact pads.

6. The semiconductor package of claim 5, wherein the one or more through package vias are arranged adjacent and substantially parallel to side faces of the semiconductor die.

7. The semiconductor package of claim 5, wherein the second contact pad has a lateral axis that is perpendicular to the direction of current flow within the semiconductor device, and wherein the one or more through package vias are arranged with respect to edges of the semiconductor die such that a current path is formed in the lateral layer at an angle $\alpha$ with respect to the lateral axis such that $0 \leq \alpha < 90°$.

8. The semiconductor package of claim 5, wherein the one or more through package vias are arranged with respect to edges of the second contact pad such that an effective cross-sectional area of the lateral current path from the second contact pad to the one or more second package pads is greater than a thickness of the lateral layer multiplied by a width of the lateral layer.

9. The semiconductor package of claim 5, further comprising a plurality of second vias extending between the second contact pad and the lateral layer, wherein the lateral layer is arranged on a second major surface of the dielectric layer.

10. The semiconductor package of claim 9, further comprising a plurality of first vias extending between the first contact pad and the one or more first package contact pads arranged on the first major surface of the dielectric layer.

11. The semiconductor package of claim 10, wherein the semiconductor device is a transistor device.

12. A semiconductor package, comprising:
a semiconductor die comprising a semiconductor device, a first contact pad arranged on a first surface of the semiconductor die, and a second contact pad arranged on a second surface of the semiconductor die that opposes the first surface, the semiconductor die being embedded in a dielectric layer;
a package footprint arranged on a first major surface of the semiconductor package, the package footprint comprising one or more first package contact pads and one or more second package contact pads arranged on a first major surface of the dielectric layer, wherein the dielectric layer has a lateral extent that is greater than the area occupied by the first and second package contact pads, the first contact pad of the semiconductor die being coupled to the one or more first package contact pads and the second contact pad of the semiconductor die being coupled to the one or more second package contact pads;
a plurality of first vias extending from the first contact pad to the one or more first package contact pads; and
a redistribution structure coupling the second contact pad to at least one second package pad of the one or more second package contact pads arranged on an opposing side of the semiconductor die,
wherein the redistribution structure comprises a lateral layer, a plurality of second vias extending through the dielectric layer and between the second contact pad and the lateral layer, and one or more package vias arranged adjacent opposing side faces of the semiconductor die,
wherein in operation, the semiconductor device causes a current to flow between the first contact pad and the second contact pad,
wherein the current is laterally distributed and flows in the lateral layer of the redistribution structure between the second contact pad and the through package vias in two laterally opposing directions.

13. The semiconductor package of claim 12, wherein the semiconductor device is a transistor device.

14. A method of fabricating a semiconductor package with a lower package resistance, the method comprising:

defining an area of a package footprint of a semiconductor package comprising a semiconductor die comprising a semiconductor device, a first contact pad arranged on a first surface of the semiconductor die, and a second contact pad arranged on a second surface of the semiconductor die that opposes the first surface, wherein the semiconductor die is embedded in a dielectric layer, wherein the package footprint is arranged on a first major surface of the semiconductor package, wherein the package footprint comprises one or more first package contact pads and one or more second package contact pads arranged on a first major surface of the dielectric layer, wherein the dielectric layer has a lateral extent that is greater than the area occupied by the first and second package contact pads, wherein in operation, the semiconductor device causes a current to flow between the first contact pad and the second contact pad;

coupling the first contact pad of the semiconductor die to the one or more first package contact pads;

coupling the second contact pad of the semiconductor die to the one or more second package contact pads by a redistribution structure having a lateral portion and a vertical portion; and arranging the vertical portion of the redistribution structure adjacent two or more side faces of the semiconductor die to laterally distribute the current flow between the first contact pad and the second contact pad in multiple non-parallel paths in the lateral portion of the redistribution structure;

wherein each of the first and second package contact pads are rectangular shaped pads with a planar outer surface that is exposed from the dielectric layer and is parallel to the first major surface of the semiconductor package, and wherein the multiple non-parallel current paths comprise at least two current paths that are not antiparallel to one another.

15. The method of claim 14, further comprising arranging the second package contact pads in the package footprint laterally adjacent two or more adjoining side faces of the semiconductor die and increasing the effective current carrying cross-sectional area of the lateral portion of the redistribution structure.

16. The method of claim 14, further comprising reducing a length of a line of sight path between the one or more first package contact pads and the one or more second package contact pads in the package footprint by splitting at least one of the one or more first package contact pads and at least one of the one or more second package contact pads into two or more portions while the area of the package footprint remains the same.

17. The semiconductor package of claim 14, wherein the multiple non-parallel current paths comprise two current paths that are antiparallel to one another, and one current path that is nonparallel to the two current paths.

18. The semiconductor package of claim 17, wherein the multiple non-parallel current paths comprise first, second and third current paths, wherein the first current path is non-parallel to the second current path, and wherein the second current path is non-parallel to the third current path.

19. The semiconductor package of claim 18, wherein the one or more first package contact pads comprise a central one of the first package contact pads that comprises first, second and third outer edge sides, the first and second outer edge sides being parallel to one another, the third outer edge side extending between the first and second outer edge sides, wherein the one or more second package contact pads face each one of the first, second and third outer edge sides of the central first package contact pad.

20. The semiconductor package of claim 19, wherein the first current path is perpendicular to the first outer edge side, wherein the second current path is perpendicular to the second outer edge side, and wherein the third current path is perpendicular to the third outer edge side.

* * * * *